Dec. 29, 1970 TAKAYUKI YANAGAWA 3,551,221
METHOD OF MANUFACTURING A SEMICONDUCTOR
INTEGRATED CIRCUIT
Filed Nov. 26, 1968

INVENTOR.
TAKAYUKI YANAGAWA
BY
Hopgood & Calimafde
ATTORNEYS

United States Patent Office 3,551,221
Patented Dec. 29, 1970

3,551,221
METHOD OF MANUFACTURING A SEMICONDUCTOR INTEGRATED CIRCUIT

Takayuki Yanagawa, Tokyo, Japan, assignor to Nippon Electric Company, Limited, Tokyo, Japan Filed Nov. 26, 1968, Ser. No. 779,071
Claims priority, application Japan, Nov. 29, 1967, 42/76,316
Int. Cl. H01l 7/34, 7/44
U.S. Cl. 148—175 4 Claims

ABSTRACT OF THE DISCLOSURE

A method for forming a semiconductor integrated circuit of the isolated type is described wherein high resistance isolation is assured. A single crystal region of, say, n-type conductivity is isolated with p-type semiconductor regions. After the formation of the p-type isolating regions the previously removed insulative oxide film is not replaced until after the formation of a p-type region in the isolated crystal region, thus rediffusing the isolating regions with a p-type impurity. Thereafter, the insulative oxide film is replaced over the isolating regions, whereby additional diffusion steps carried out with the isolated region cannot cause the formation of n-type inversion layers between the isolating regions and the overlying insulative oxide film.

The present invention relates to a semiconductor integrated circuit, and to a method of manufacturing same.

A method of manufacturing a semiconductor integrated circuit has conventionally been such as shown in FIG. 1, wherein a p-type silicon wafer 1 is provided with an $n^+$-type buried layer 2 diffused through one surface thereof into the substrate (FIG. 1*a*), an n-type single crystal region 3 is epitaxially grown on the entire surface thereof (FIG. 1*b*), a silicon oxide film 4 is formed thereupon with a window 5 being provided in the oxide film 4 for selective diffusion, p-type impurities being diffused into the n-type single crystal epitaxial layer 3 through window 5 to form p-type isolating diffused regions 6 which reach the p-type silicon wafer region 1 by diffusion, with said n-type single crystal epitaxial layer 3 being divided into a desired number of isolated regions with said isolating diffusion regions 6 (FIG. 1*c*), the entire surface of said n-type single crystal epitaxial layer 3 again being covered with a silicon oxide film 7, a window 8 being provided therein for forming a circuit element within the isolated n-type single crystal layer 3 by diffusing p-type impurities, p-type impurities are then diffusion through said window 8 into the n-type single crystal layer 3 to form a $p^+$-layer 9, resulting in a p-n junction 10 (FIG. 1*d*), the desired number of circuit elements being formed within the desired isolated region by diffusing n- and/or p-type impurities in accordance with conventional techniques.

There are also other methods of forming isolated regions such as "bottom isolation method" wherein the p-type isolating diffused region 6 is formed by selectively diffusing p-type impurities from the top surface of the epitaxial layer as well as from the bottom thereof or interface between the epitaxial layer and p-type silicon wafer, and the "triple diffused process" wherein p-type impurities are introduced into both sides of the n-type wafer, with only one side masked by the oxide film, the p-type impurities diffusing from both sides of the wafer until the two diffusion fronts meet in the center of the wafer to form n-type isolated single crystal regions wtihout using an epitaxial layer.

In any of the conventional methods of fabricating a semiconductor integrated circuit described hereinbefore, p-type isolating diffused regions are formed in order to isolate n-type single crystal regions wherein the p-type regions are covered with an oxide film after diffusion, the film being kept thereon during the following process of forming the circuit elements.

The p-type impurities, however, within the p-type isolating diffused regions segregate into the oxide covering the diffused regions, causing an undesirable effect on the circuit performance. Namely, the p-type impurities near the oxide film 7 covering the $p^+$ isolating diffused region 6 segregate in the oxide film during the following diffusion process, especially during the oxide-film-forming process, and the p-type impurity concentration near the surface of the $p^+$ isolating diffused region 6 decreases as shown in FIG. 2, inverting the conductivity type thereof into n-type, thus degrading the isolation resistance between adjacent but isolated n-type single crystal layers 3.

The present invention provides a novel method of fabricating an integrated circuit, eliminating the aforementioned disadvantage of the convnetional method. It is therefore an object of the present invention to provide a method of fabricating a semiconductor integrated circuit wherein the formation of an n-type inversion layer is prevented.

It is a further object of this invention to provide a method of fabricating a diffusion isolated semiconductor integrated circuit wherein isolation resistance degeneration due to undersirable inversion layers is prevented.

It is anothe object of the present invention to provide a method of forming a p-type isolating diffused region having high impurity concentration at the surface thereof after formation of a completed semiconductor device.

It is a further object of the present invention to provide a method of manufacturing an integrated circuit wherein p-type impurities are rediffused into the $p^+$-type isolating diffused regions at the same time as p-type impurities are diffused into the n-type single crystal layer.

It is a still further object of the present invention to provide a method of preventing an n-type or p-type inversion layer on the isolating diffused region of an integrated circuit without adding a process step to the conventional method, which inversion may take place during the formation of other elements if the novel method is not used.

The above-mentioned and other features and objects of this invention and the manner of attaining them will become more apparent and the invention itself will best be understood by reference to the following description of an embodiment of the invention taken in conjunction with the accompanying drawings, the description of which follows.

The present invention will now be described in detail referring to the accompanying drawings.

Figure 1:
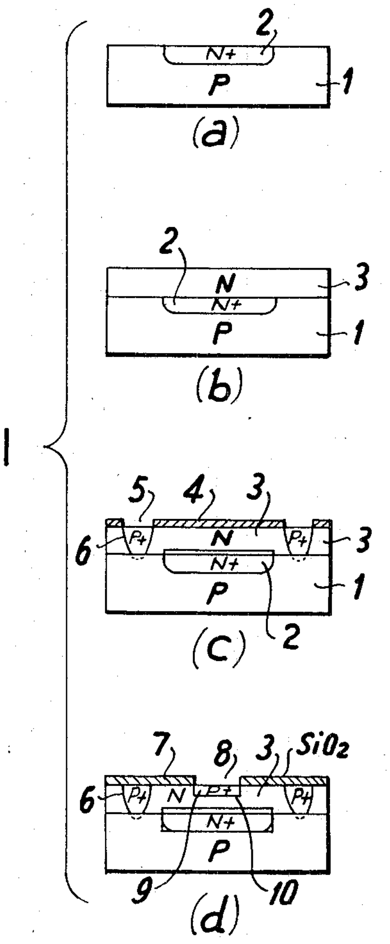
FIG. 1 shows the method of manufacturing the conventional semiconductor integrated circuit.
Figure 3:
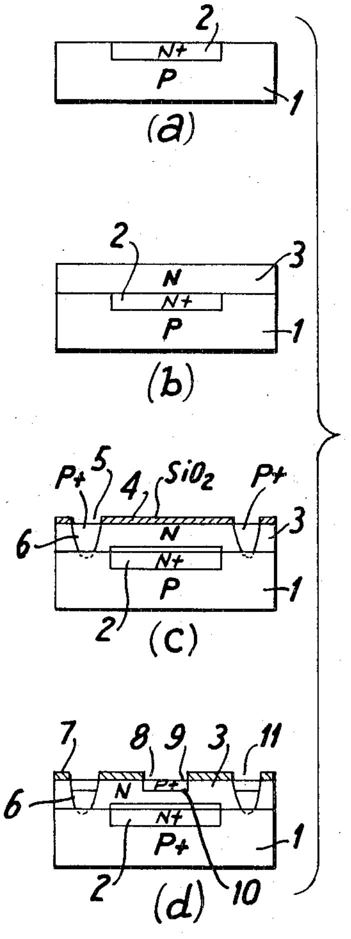
FIG. 3 shows an embodiment of the method of manufacturing semiconductor integrated circuits in accordance with the present invention.

FIGS. 3*a* through 3*d* show the sequence of the method of fabrication in accordance with the present invention, wherein FIGS. 3*a* through 3*c* are identical to the conventional method shown in FIGS. 1*a* through 1*c*, showing the processes for forming the buried layer 2, epitaxial layer 3 and isolating diffused region 6. The same number in FIGS. 3*a* through 3*c* refers to the same regions as in FIGS. 1*a* through 1*c*.

Figure 2:
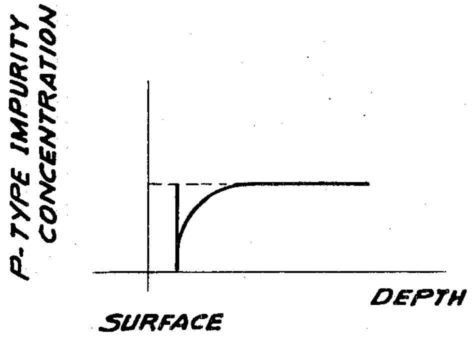
FIG. 2 is a graph showing the p-type impurity concentration distribution of the isolating diffusion region in accordance with the conventional manufacturing method.

After the $p^+$-type isolating diffused region 6 is formed in FIG. 2*c*, a window 11 is opened in the portion of the oxide film 7 opposite the $p^+$-type isolating diffused region 6 at the same time as a window is opened in the oxide film 7 in order to form a circuit element within the n-type single crystal layer 3. The p-type isolating diffused region 6 being exposed, p-type impurities are rediffused into the $p^+$-type isolating diffused region 6 at the same time when the p-type diffused region 9 is formed within the n-type single crystal 3. The $p^+$-type isolated region 6 then is covered with an oxide film like FIG. 1*d*.

As p-type impurities are rediffused into the $p^+$-type isolating diffused region 6 in accordance with the present invention, the p-type impurity concentration becomes extremely high, and thus the formation of an n-type inversion layer is prevented even if a portion of the p-type impurities segregates in the oxide film during the following processes.

As the rediffusion of the p-type impurities into the $p^+$-type isolating diffused region 6 is performed at the same time when the p-type impurities are diffused into the n-type single crystal layer 3 for forming the circuit elements, the novel method in accordance with the present does not require an additional process step.

Although a specific embodiment of the present invention is described in the description herein, it will be understood that the embodiment is for purposes of clarifying the disclosure only and is not to be interpreted as any limitation on the scope of the present invention. For instance, the inverse of the embodiment may be constructed where instead of an n-type inversion layer forming directly adjacent and over the isolating region a p-type inversion layer is formed with, of course, the other layers being suitably inversed as is well known in the art. Therefore, it will be apparent that variations of the present invention will be apparent to those skilled in the art and that the present invention will be limited only by the spirit and scope of what is claimed herein.

I claim:

1. A method of fabricating a semiconductor integrated circuit comprising isolating an n-type single crystal region with a p-type isolating diffused region, and rediffusing p-type impurities into said p-type isolating diffused region, simultaneously with diffusion of p-type impurities into said n-type crystal for forming a partial semiconductor circuit element within said n-type single crystal region.

2. A method of fabricating a semiconductor integrated circuit comprising:

forming an isolating diffused region of a first conductivity type to isolate a single crystal region of a second conductivity type opposite to the first conductivity type, forming a second diffused region in the isolated single crystal region with first conductivity impurities used in said isolating diffused region and simultaneously rediffusing said first conductivity impurities into said isolating diffused region.

3. A method of fabricating a semiconductor integrated circuit comprising:

forming a single crystal semiconductor layer of a first conductivity type on a semiconductor material of a second opposite conductivity type, forming an insulative oxide layer over the single crystal semiconductor layer, removing selected portions of the insulative oxide layer to expose the underlying single crystal semiconductor layer, forming diffused isolating regions in the exposed single crystal semiconductor layer with said isolating regions having a second conductivity opposite to that of the single crystal semiconductor layer and isolating a portion of the single crystal semiconductor layer, removing a selected portion of the insulative oxide layer at a location opposite the isolated portion of the single crystal layer, diffusing impurities of the second conductivity type through the removed portions of the insulative oxide film to form a semiconductor region of the second conductivity type in the isolated portion and simultaneously rediffusing said second conductivity type of impurities into the isolating regions, and reforming said insulative oxide film over said isolating regions, whereby the further diffusion processes employed in the completion of an integrated circuit over the isolated portion of the semiconductor single crystal layer are prevented from causing the formation of inversion layers between the isolating regions and the overlying insulative oxide film.

4. The method as recited in claim 3 wherein the single crystal semiconductor layer is formed with a material exhibiting n-type conductivity and wherein the isolating regions exhibit a p-type conductivity.

References Cited

UNITED STATES PATENTS

| | | | |
|---|---|---|---|
| 3,347,720 | 10/1967 | Bryan et al. ________ | 148—187 |
| 3,370,995 | 2/1968 | Lowery et al. ______ | 148—175 |

L. DEWAYNE RUTLEDGE, Primary Examiner

R. A. LESTER, Assistant Examiner

U.S. Cl. X.R.

29—578: 148—174, 187; 317—235